(12) United States Patent
Muranaka (10) Patent No.: US 11,362,642 B2
(45) Date of Patent: Jun. 14, 2022

(54) ACOUSTIC WAVE FILTER DEVICE, COMPOSITE FILTER DEVICE, AND MULTIPLEXER

(71) Applicant: Murata Manufacturing Co., Ltd., Nagaokakyo (JP)

(72) Inventor: Hiroshi Muranaka, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 237 days.

(21) Appl. No.: 16/703,932

(22) Filed: Dec. 5, 2019

(65) Prior Publication Data

US 2020/0112299 A1    Apr. 9, 2020

Related U.S. Application Data

(63) Continuation of application No. PCT/JP2018/022521, filed on Jun. 13, 2018.

(30) Foreign Application Priority Data

Jun. 20, 2017  (JP) .............................. JP2017-120411

(51) Int. Cl.
 *H03H 9/64* (2006.01)
 *H03H 9/72* (2006.01)
 (Continued)

(52) U.S. Cl.
 CPC ...... *H03H 9/6483* (2013.01); *H03H 9/02637* (2013.01); *H03H 9/145* (2013.01); *H03H 9/25* (2013.01); *H03H 9/72* (2013.01)

(58) Field of Classification Search
 CPC ............. H03H 9/02; H03H 9/64; H03H 9/725
 See application file for complete search history.

(56) References Cited

U.S. PATENT DOCUMENTS 5,521,453 A    5/1996  Yatsuda
6,819,203 B2 * 11/2004 Taniguchi ............ H03H 9/6433
                                                        333/193

(Continued)

FOREIGN PATENT DOCUMENTS

JP       07-131290 A    5/1995
JP       2013-081118 A  5/2013

(Continued)

OTHER PUBLICATIONS

Official Communication issued in International Patent Application No. PCT/JP2018/022521, dated Sep. 4, 2018.

*Primary Examiner* — Dean O Takaoka
*Assistant Examiner* — Alan Wong
(74) *Attorney, Agent, or Firm* — Keating & Bennett, LLP (57) ABSTRACT

An acoustic wave filter device includes a longitudinally coupled resonator acoustic wave filter on a series arm that connects an input terminal and an output terminal, first and second parallel arm resonators on first and second parallel arms that connect the series arm and a ground potential, an input-side ground port of the longitudinally coupled resonator acoustic wave filter and a ground port of at least one of the first and second parallel arm resonators are connected in common, an output-side ground port of the longitudinally coupled resonator acoustic wave filter and a ground port of at least another of the first and second parallel arm resonators are connected in common, and an electrostatic capacitance of the first parallel arm resonator is different from an electrostatic capacitance of the second parallel arm resonator.

20 Claims, 5 Drawing Sheets

(51) Int. Cl.
  *H03H 9/02* (2006.01)
  *H03H 9/145* (2006.01)
  *H03H 9/25* (2006.01)

(56) References Cited

U.S. PATENT DOCUMENTS

| | | | | |
|---|---|---|---|---|
| 8,179,211 B2* | 5/2012 | Bauer | ................ | H03H 9/14597 |
| | | | | 333/195 |
| 9,083,314 B2* | 7/2015 | Tsurunari | ................ | H03H 9/725 |
| 9,184,728 B2* | 11/2015 | Takamine | ............ | H03H 9/6433 |
| 9,998,098 B2* | 6/2018 | Takata | ................. | H03H 9/6483 |
| 10,270,426 B2* | 4/2019 | Takamine | ............ | H03H 9/0576 |
| 2012/0313724 A1 | 12/2012 | Tsurunari et al. | | |
| 2017/0099044 A1 | 4/2017 | Takamine | | |
| 2017/0117873 A1* | 4/2017 | Takata | ................. | H03H 9/0576 |

FOREIGN PATENT DOCUMENTS

| | | |
|---|---|---|
| JP | 2017-085262 A | 5/2017 |
| WO | 2011/061904 A1 | 5/2011 |
| WO | 2016/013330 A1 | 1/2016 |

\* cited by examiner

ACOUSTIC WAVE FILTER DEVICE, COMPOSITE FILTER DEVICE, AND MULTIPLEXER

CROSS REFERENCE TO RELATED APPLICATIONS

This application claims the benefit of priority to Japanese Patent Application No. 2017-120411 filed on Jun. 20, 2017 and is a Continuation Application of PCT Application No. PCT/JP2018/022521 filed on Jun. 13, 2018. The entire contents of each application are hereby incorporated herein by reference.

BACKGROUND OF THE INVENTION

1. Field of the Invention

The present invention relates to an acoustic wave filter device including a longitudinally coupled resonator acoustic wave filter and a plurality of parallel arm resonators, and a composite filter device and a multiplexer each including such an acoustic wave filter device.

2. Description of the Related Art

In an acoustic wave filter device described in Japanese Unexamined Patent Application Publication No. 2013-81118, a ladder filter is connected in series to a longitudinally coupled resonator acoustic wave filter. A ground port of a parallel arm resonator of the ladder filter and a ground port of the longitudinally coupled resonator acoustic wave filter are electrically isolated from each other.

On the other hand, in FIG. 11 of International Publication No. 2011/061904, a prior art acoustic wave filter device is disclosed. In this acoustic wave filter device, a ladder filter is connected in series to a longitudinally coupled resonator acoustic wave filter. A ground port of a parallel arm resonator of the ladder filter and an input-side ground port and an output-side ground port of the longitudinally coupled resonator acoustic wave filter are connected in common.

In the acoustic wave filter device described in Japanese Unexamined Patent Application Publication No. 2013-81118, enhancement of the ground is not sufficient. On the other hand, in the acoustic wave filter device described in FIG. 11 of International Publication No. 2011/061904, the ground can be enhanced. However, a response caused by a harmonic wave appears on a higher frequency side beyond a pass band of the acoustic wave filter device, and an attenuation characteristic is not sufficient.

SUMMARY OF THE INVENTION

Preferred embodiments of the present invention provide acoustic wave filter devices that each achieve improvements of attenuation characteristics in a specific frequency band in an attenuation range outside a pass band.

An acoustic wave filter device according to a preferred embodiment of the present invention includes a series arm connecting an input terminal and an output terminal and a plurality of parallel arms connected between the series arm and a ground potential. The acoustic wave filter device includes a longitudinally coupled resonator acoustic wave filter on the series arm, the longitudinally coupled resonator acoustic wave filter including an input port to which a signal is input, an output port from which a signal is output, an input-side ground port connected to the ground potential, and an output-side ground port connected to the ground potential; and a first parallel arm resonator provided on a first parallel arm and a second parallel arm resonator provided on a second parallel arm, the first parallel arm and the second parallel arm being included in the plurality of parallel arms, wherein the input-side ground port of the longitudinally coupled resonator acoustic wave filter and a ground port of at least one of the first and second parallel arm resonators are connected in common, the output-side ground port of the longitudinally coupled resonator acoustic wave filter and a ground port of at least another one of the first and second parallel arm resonators are connected in common, and an electrostatic capacitance of the first parallel arm resonator is different from an electrostatic capacitance of the second parallel arm resonator.

In an acoustic wave filter device according to a preferred embodiment of the present invention, the acoustic wave filter device further including a series arm resonator on the series arm, and the series arm resonator and at least one of the first and second parallel arm resonators define a ladder filter. In this case, the filter characteristics of the acoustic wave filter device are able to be further improved.

In an acoustic wave filter device according to a preferred embodiment of the present invention, the input-side ground port and the output-side ground port of the longitudinally coupled resonator acoustic wave filter are connected in common. In this case, the ground is able to be improved. Further, the attenuation characteristics near the pass band are able to be effectively improved.

In an acoustic wave filter device according to a preferred embodiment of the present invention, the acoustic wave filter device further includes a piezoelectric substrate on which the longitudinally coupled resonator acoustic wave filter and the first and second parallel arm resonators are provided, wherein first and second lead wires are provided on the piezoelectric substrate and connected to ground potential-side end portions of the first and second parallel arm resonators, respectively.

In an acoustic wave filter device according to a preferred embodiment of the present invention, a first inductance including an inductance of the first lead wire between the ground potential-side end portion of the first parallel arm resonator and the ground potential is different from a second inductance including an inductance of the second lead wire between the ground potential-side end portion of the second parallel arm resonator and the ground potential. In this case, attenuation poles are able to be provided in different frequency ranges by utilizing a resonance characteristic of a first LC resonance due to the electrostatic capacitance of the first parallel arm resonator and the first inductance and a resonance characteristic of a second LC resonance due to the electrostatic capacitance of the second parallel arm resonator and the second inductance.

A composite filter device according to a preferred embodiment of the present invention includes a plurality of filter devices, one-end portions of which are connected in common to a common terminal, wherein at least one of the plurality of filter devices is defined by an acoustic wave filter device according to a preferred embodiment of the present invention.

A multiplexer according to a preferred embodiment of the present invention includes a plurality of band pass filters having different pass bands, one-end portions of the plurality of band pass filters being connected in common, and at least one of the plurality of band pass filters is defined by an acoustic wave filter device according to a preferred embodiment of the present invention.

The acoustic wave filter devices according to preferred embodiments of the present invention each enable a plurality of attenuation poles to be provided outside a pass band, thus enabling the improvement of the attenuation characteristic in a specific frequency band in an attenuation range outside the pass band by selecting electrostatic capacitances of the first and second parallel arm resonators. Accordingly, this achieves composite filter devices and multiplexers each including an acoustic wave filter device having an excellent out-of-band attenuation characteristic.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention is disclosed in detail by describing specific preferred embodiments of the present invention with reference to the drawings.

Each preferred embodiment described in the present specification is for illustrative purposes only, and elements of different preferred embodiments may be partially exchanged or combined.

Figure 1:
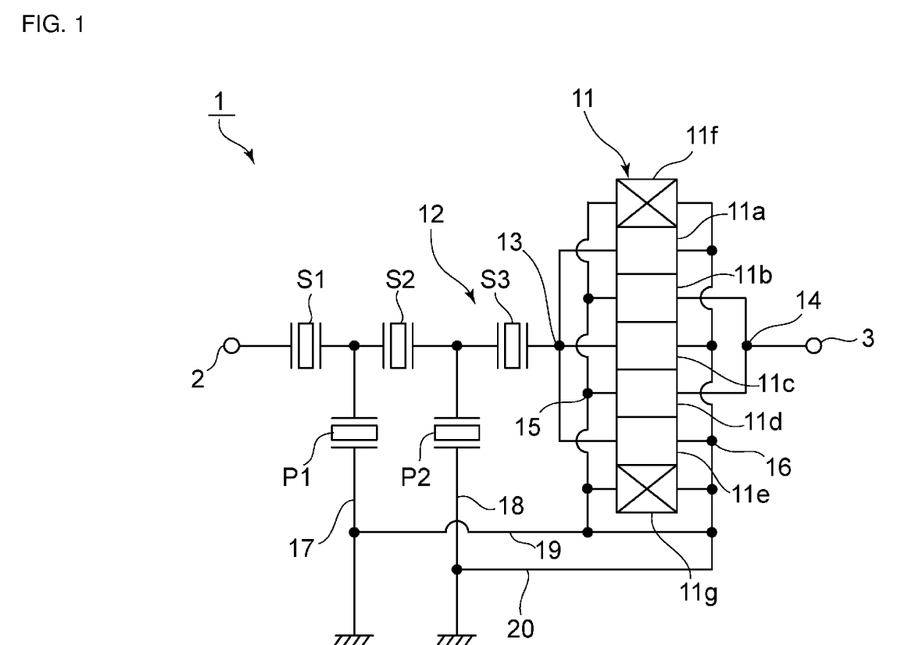
FIG. 1 is a circuit diagram of an acoustic wave filter device according to a first preferred embodiment of the present invention.

FIG. 1 is a circuit diagram of an acoustic wave filter device according to a first preferred embodiment of the present invention.

An acoustic wave filter device 1 is preferably, for example, a reception filter of Band 20. A reception band of Band 20, namely, a pass band thereof is about 791 MHz to about 821 MHz, for example.

The acoustic wave filter device 1 includes an input terminal 2 and an output terminal 3. A longitudinally coupled resonator acoustic wave filter 11 is provided on a series arm that connects the input terminal 2 and the output terminal 3. A ladder filter 12 is connected in series to the longitudinally coupled resonator acoustic wave filter 11.

The longitudinally coupled resonator acoustic wave filter 11 includes first to fifth interdigital transducer electrodes 11a to 11e and reflectors 11f and 11g. In other words, the longitudinally coupled resonator acoustic wave filter 11 is a five interdigital transducer longitudinally coupled resonator acoustic wave filter.

The longitudinally coupled resonator acoustic wave filter 11 includes an input port 13 to which a signal is input and an output port 14 from which a signal is output. Input ports of the first, third, and fifth interdigital transducer electrodes 11a, 11c, and 11e are connected in common to the input port 13. Output ports of the second and fourth interdigital transducer electrodes 11b and 11d are connected in common to the output port 14. End portions of the second and fourth interdigital transducer electrodes 11b and 11d on the side opposite to the output port side and one-ports of the reflectors 11f and 11g are connected in common to an input-side ground port 15. End portions of the first, third, and fifth interdigital transducer electrodes 11a, 11c, and 11e on the side opposite to the input-side end portions and the other ports of the reflectors 11f and 11g are connected in common to an output-side ground port 16.

The ladder filter 12 includes a plurality of series arm resonators S1 to S3 and first and second parallel arm resonators P1 and P2. The plurality of series arm resonators S1 to S3 are connected in series on the series arm.

The first parallel arm resonator P1 is provided on a first parallel arm connecting a connection point between the series arm resonator S1 and the series arm resonator S2 and a ground potential.

The second parallel arm resonator P2 is provided on a second parallel arm connecting a connection point between the series arm resonator S2 and the series arm resonator S3 and the ground potential.

Note that a portion connecting a ground potential-side end portion of the first parallel arm resonator P1 and the ground potential includes a first lead wire 17 connected to the first parallel arm resonator P1. A portion connecting a ground potential-side end portion of the second parallel arm resonator P2 and the ground potential includes a second lead wire 18 connected to the second parallel arm resonator P2.

The input-side ground port 15 and the output-side ground port 16 of the longitudinally coupled resonator acoustic wave filter 11 are connected to a third lead wire 19 as illustrated in FIG. 1 and connected in common to the ground potential. The third lead wire 19 is connected to the first lead wire 17. Further, a fourth lead wire 20 is connected to the third lead wire 19. The fourth lead wire 20 is connected to the second lead wire 18.

The electrostatic capacitance of the first parallel arm resonator P1 is different from the electrostatic capacitance of the second parallel arm resonator P2.

A preferable feature of the acoustic wave filter device is that the input-side ground port 15 of the longitudinally coupled resonator acoustic wave filter 11 and the ground port of the first parallel arm resonator P1 are connected in common, the output-side ground port 16 of the longitudinally coupled resonator acoustic wave filter 11 and the ground port of the second parallel arm resonator P2 are connected in common, and the electrostatic capacitance of the first parallel arm resonator P1 is different from the electrostatic capacitance of the second parallel arm resonator P2. This enables a sufficient attenuation to be obtained in a specific frequency band in an attenuation range. This is described with reference to FIG. 3 by comparing with a comparative example of FIG. 2.

As a working example of the acoustic wave filter device 1 of the first preferred embodiment, an acoustic wave filter device is fabricated using the following design parameters.

The longitudinally coupled resonator acoustic wave filter 11 and the ladder filter 12 are defined by providing electrode structures on the same piezoelectric substrate.

Design parameters of the longitudinally coupled resonator acoustic wave filter 11: With regard to the first to fifth interdigital transducer electrodes 11a to 11e and the reflectors 11f and 11g, values illustrated in the following Table 1 are used for the number of electrode fingers, the wavelength determined by the electrode finger pitch, the electrode finger intersecting width, and the duty ratio.

TABLE 1

| Parameter | Reflector | Interdigital Transducer Electrode | | | | | Reflector |
|---|---|---|---|---|---|---|---|
| | 11f | 11a | 11b | 11c | 11d | 11e | 11g |
| Number of Electrode Fingers (Number) | 28 | 22 | 48 | 40 | 48 | 22 | 28 |
| Wavelength [μm] | 4.672 | 4.469 | 4.509 | 4.512 | 4.509 | 4.469 | 4.672 |
| Intersecting Width [μm] | | | | 116 | | | |
| Duty | | | | 0.5 | | | |

As an electrode material of the first to fifth interdigital transducer electrodes 11a to 11e and the reflectors 11f and 11g, for example, a multilayer film of AlCu/Ti/Pt/NiCr is preferably used. The thicknesses of the respective layers are preferably, for example, about 184 nm/about 70 nm/86 nm/about 10 nm.

Design parameters illustrated in the following Table 2 are used for the series arm resonators S1 to S3 and the first and second parallel arm resonators P1 and P2.

TABLE 2

| | S1 | S2 | S3 | P1 | P2 |
|---|---|---|---|---|---|
| Number of Electrode Fingers of Interdigital Transducer (Number) | 161 | 99 | 137 | 251 | 101 |
| Intersecting Width [μm] | 73 | 78 | 78 | 76 | 108 |
| Duty | 0.5 | 0.5 | 0.5 | 0.5 | 0.5 |
| Number of Electrode Fingers of Reflector (Number) | 16 | 16 | 16 | 16 | 16 |

Note that as an electrode material, for example, a multilayer film of AlCu/Ti/Pt/NiCr is preferably used. The thicknesses of the respective layers are preferably, for example, about 184 nm/about 70 nm/about 86 nm/about 10 nm.

Further, the electrostatic capacitance of the first parallel arm resonator P1 is preferably about 4.94 pF, for example, and the electrostatic capacitance of the second parallel arm resonator P2 is preferably about 2.82 pF, for example.

The first and second lead wires 17 and 18 connected to the ground potential-side end portions of the first and second parallel arm resonators P1 and P2 each define a portion of a path from the piezoelectric substrate to a mounting board.

Figure 2:
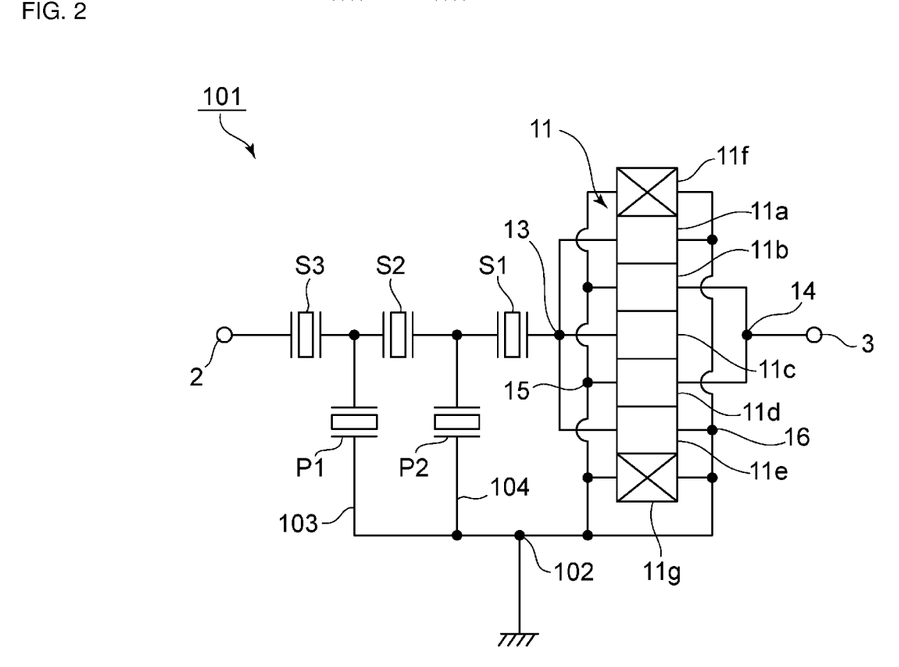
FIG. 2 is a circuit diagram of an acoustic wave filter device of a comparative example.

An acoustic wave filter device 101 of the comparative example illustrated FIG. 2 is prepared in the following manner. Note that the acoustic wave filter device 101 of the comparative example is similar to the foregoing working example except that the input-side ground port 15 and the output-side ground port 16 of the longitudinally coupled resonator acoustic wave filter 11 and the first and second parallel arm resonators P1 and P2 are connected in common to a common connection point 102 on a piezoelectric substrate, this common connection point 102 is connected to the ground potential, and the electrostatic capacitances of the first and second parallel arm resonators P1 and P2 are equal or substantially equal to each other.

The electrostatic capacitances of the first and second parallel arm resonators P1 and P2 are about 3.88 pF, for example.

The first lead wire 103 connecting the ground potential-side end portion of the first parallel arm resonator P1 and the common connection point 102 is comparable in length to the second lead wire 104 connecting the ground potential-side end portion of the second parallel arm resonator P2 and the common connection point 102. The solid line of FIG. 3 denotes the filter characteristics of the acoustic wave filter device of the working example, and the dashed line of FIG. 3 denotes the filter characteristics of the acoustic wave filter device of the comparative example.

Figure 3:
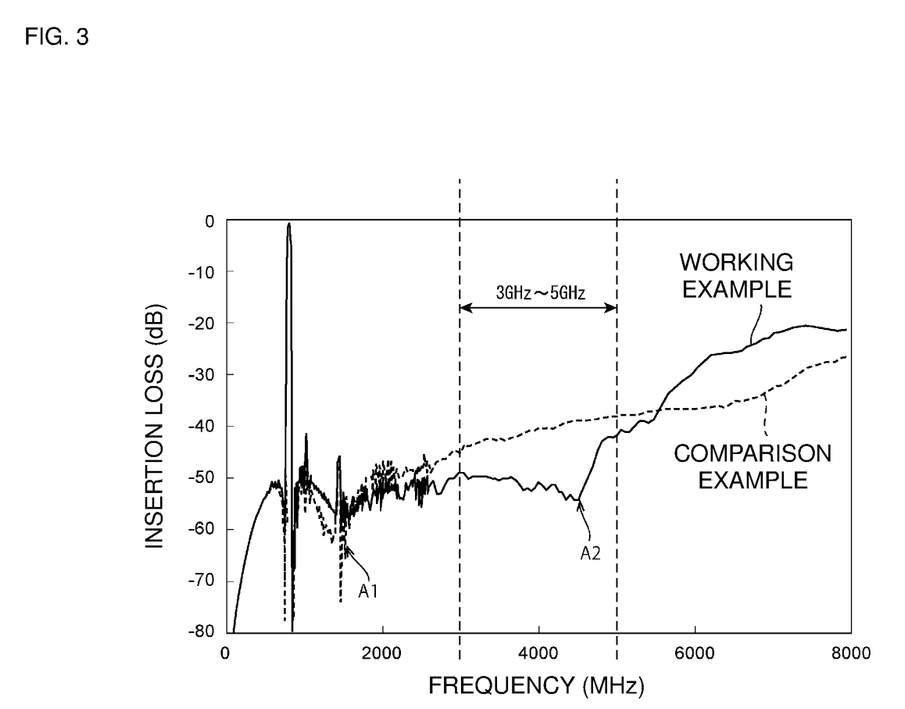
FIG. 3 is a diagram illustrating filter characteristics of acoustic wave filter devices of a working example and the comparative example.

As is evident from FIG. 3, in both the working example and the comparative example, the filter characteristics of about 791 MHz to about 821 MHz, which is a pass band, are substantially comparable to each other. On the other hand, in an attenuation range of about 3 GHz to about 5 GHz outside the pass band, compared with the comparative example, the working example enables a sufficient attenuation to be obtained. A range of about 3 GHz to about 5 GHz is a frequency band to be used in WiFi and the like, for example.

In recent years, in smartphones and the like, a number of filters such as transmission filters and reception filters of a plurality of bands, filters to be used in WiFi or GPS, and the like are connected in common to an antenna port. Accordingly, for example, in the reception filter of Band 20, it is preferable to have a sufficiently large attenuation in about 3 GHz to about 5 GHz, which is the range to be used for WiFi, for example. As illustrated in FIG. 3, the working example sufficiently enables increased attenuation in about 3 GHz to about 5 GHz. In other words, the filter characteristic can be effectively improved.

Note that it is considered that the acoustic wave filter device 1 of the working example has a sufficiently large attenuation in about 3 GHz to about 5 GHz, for example, because of the appearance of an attenuation pole denoted by the arrow A2 in addition to an attenuation pole denoted by the arrow A1. The attenuation pole denoted by the arrow A1 and the attenuation pole denoted by the arrow A2 are caused by a resonance characteristic due to a LC resonance that uses the first and second parallel arm resonators P1 and P2.

In the working example, the electrostatic capacitance of the first parallel arm resonator P1 is different from the electrostatic capacitance of the second parallel arm resonator P2. Accordingly, frequency positions of a resonance point and an antiresonance point of a first LC resonance due to the electrostatic capacitance of the first parallel arm resonator P1 and an inductance component of the first lead wire 17 are significantly different from frequency positions of a resonance point and an antiresonance point of a second LC resonance due to the electrostatic capacitance of the second parallel arm resonator P2 and an inductance component of the second lead wire 18. Therefore, in addition to the attenuation pole denoted by the arrow A1, the attenuation pole denoted by the arrow A2 appears in the 3 GHz to 5 GHz band.

On the other hand, in the acoustic wave filter device 101 of the comparative example, the electrostatic capacitances of the first and second parallel arm resonators P1 and P2 are equal or substantially equal to each other, and the lengths of the first and second lead wires 103 and 104 are substantially comparable to each other. Therefore, two attenuation poles appear near the pass band, and these attenuation poles are not positioned in the about 3 GHz to about 5 GHz band away from the pass band.

As described above, in the acoustic wave filter device 1, the frequency positions of the attenuation poles based on the first and second LC resonances are separated from each other. This enables the attenuation characteristic in the frequency band of about 3 GHz to about 5 GHz, for example, to be improved.

Note that in preferred embodiments of the present invention, in improving the attenuation from the pass band to a specific frequency band, this specific frequency band is not limited to any particular band. Once a specific frequency band where the attenuation needs to be increased sufficiently is determined in the attenuation range, it is only necessary to make the electrostatic capacitances of the first and second parallel arm resonators P1 and P2 different from each other such that an attenuation pole appears in that specific frequency band. Further, the lengths of the first and second lead wires 17 and 18 may be adjusted such that the attenuation pole appears in the specific frequency band.

Figure 4:
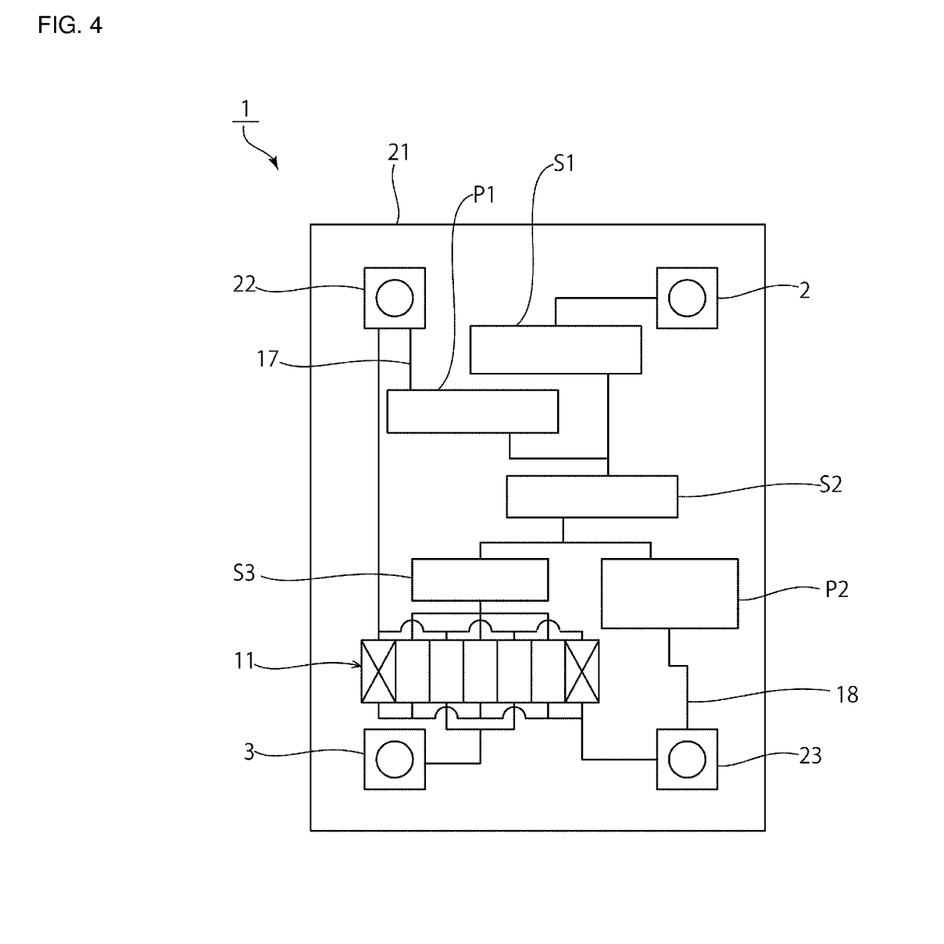
FIG. 4 is a schematic plan view of the acoustic wave filter device according to the first preferred embodiment of the present invention.

FIG. 4 is a schematic plan view of the acoustic wave filter device of the first preferred embodiment. On the piezoelectric substrate 21, an electrode structure illustrated in FIG. 4 is provided. That is, on the piezoelectric substrate 21, the longitudinally coupled resonator acoustic wave filter 11 and the series arm resonators S1, S2, and S3 are connected between the input terminal 2 and the output terminal 3. Ground terminals 22 and 23 to be connected to the ground potential are provided on the piezoelectric substrate 21. The first lead wire 17 is connected to the ground potential-side end portion of the first parallel arm resonator P1. The first lead wire 17 is connected to the ground terminal 22. The second lead wire 18 is connected to the ground potential-side end portion of the second parallel arm resonator P2. The second lead wire 18 is connected to the ground terminal 23. The frequencies at which the attenuation poles of the first and second LC resonances appear can be adjusted by making the lengths of the first lead wire 17 and the second lead wire 18 different from each other or by taking a similar measure.

Figure 5:
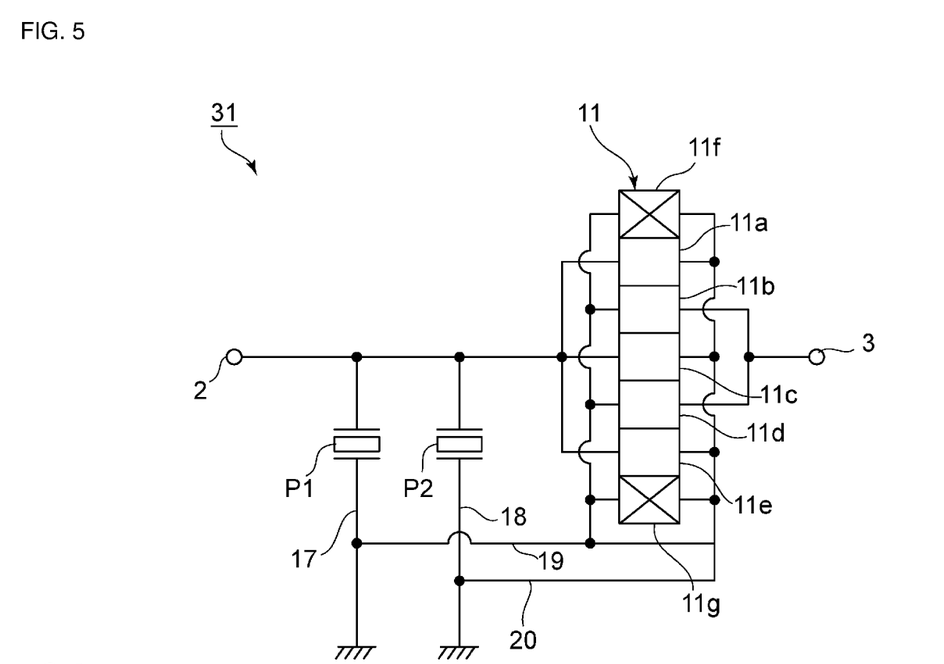
FIG. 5 is a circuit diagram of an acoustic wave filter device according to a second preferred embodiment of the present invention.

FIG. 5 is a circuit diagram of an acoustic wave filter device according to a second preferred embodiment of the present invention. In an acoustic wave filter device 31 of the second preferred embodiment, the series arm resonators S1 to S3 illustrated in FIG. 1 are not provided. With regard to the other points, the acoustic wave filter device 31 is similar to the acoustic wave filter device 1.

As is the case with the acoustic wave filter device 31 of the second preferred embodiment, in preferred embodiments of the present invention, the ladder filter is not necessarily connected in series to the longitudinally coupled resonator acoustic wave filter 11. It is only necessary to provide the first and second parallel arm resonators P1 and P2 on the first and second parallel arms, respectively. In this case, as long as the electrostatic capacitances of the first parallel arm resonator P1 and the second parallel arm resonator P2 are different from each other, the positions of attenuation poles can be made different from each other. Here, the positions of the attenuation poles are determined by the resonance points and antiresonance points of the first and second LC resonances in the first and second parallel arm resonators P1 and P2, respectively. Accordingly, also in the acoustic wave filter device 31 of the present preferred embodiment, the attenuation in a specific frequency band outside the pass band can be made sufficiently large.

However, it is preferable that a ladder filter includes the series arm resonators S1 to S3 and at least one of the first and second parallel arm resonators P1 and P2. This enables the steepness of the filter characteristic near the pass band of the acoustic wave filter device to be effectively increased.

Further, in the acoustic wave filter devices 1 and 31 of the first and second preferred embodiments, the input-side ground port 15 and the output-side ground port 16 of the longitudinally coupled resonator acoustic wave filter 11 are connected in common. Alternatively, the input-side ground port 15 and the output-side ground port 16 may be separately connected to the ground potential. However, as is the case with the acoustic wave filter devices 1 and 31, the input-side ground port 15 and the output-side ground port 16 are preferably connected in common within an acoustic wave filter chip. Because of this, degradation of the attenuation characteristic near the pass band hardly occur.

Further, a first inductance including the inductance of the first lead wire 17 is preferably different from a second inductance including the inductance of the second lead wire 18. Accordingly, the first lead wire 17 is preferably different from the second lead wire 18 in length. This enables the differences between the frequency positions of the resonance point and the antiresonance point of the first LC resonance and the frequency positions of the resonance point and the antiresonance point of the second LC resonance to be increased.

Figure 6:
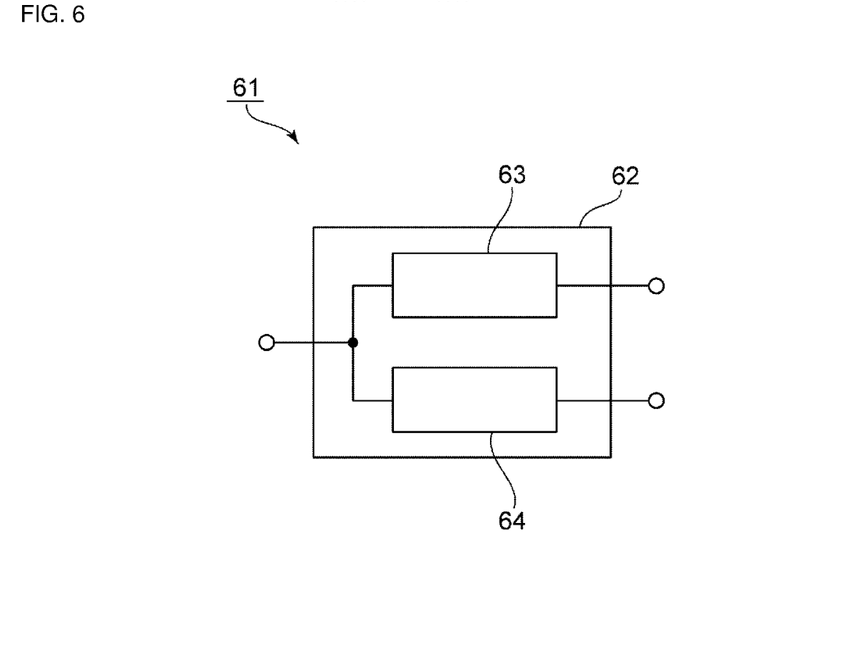
FIG. 6 is a circuit diagram illustrating a duplexer as a third preferred embodiment of the present invention.

FIG. 6 is a circuit diagram illustrating a duplexer according to a third preferred embodiment of the present invention. A duplexer 61 includes a chip main body 62. Inside the chip main body 62, first and second band pass filters 63 and 64 are provided. The first band pass filter 63 is a transmission filter, and the second band pass filter 64 is a reception filter. One-end portions of the first and second band pass filters 63 and 64 are connected in common.

Note that the first and second band pass filters 63 and 64 are not necessarily the reception filter and the transmission filter of the same band. Further, preferred embodiments of the present invention are applicable to not only the duplexer 61 but also various multiplexers, such as a triplexer, for example, in which three or more band pass filters are connected in common and the like.

In the duplexer 61 of FIG. 6, an acoustic wave filter device configured in accordance with a preferred embodiment of the present invention is included in at least one of the first band pass filter 63 and the second band pass filter 64. This enables the attenuation in a specific frequency range outside the pass band to be sufficiently increased.

Figure 7:
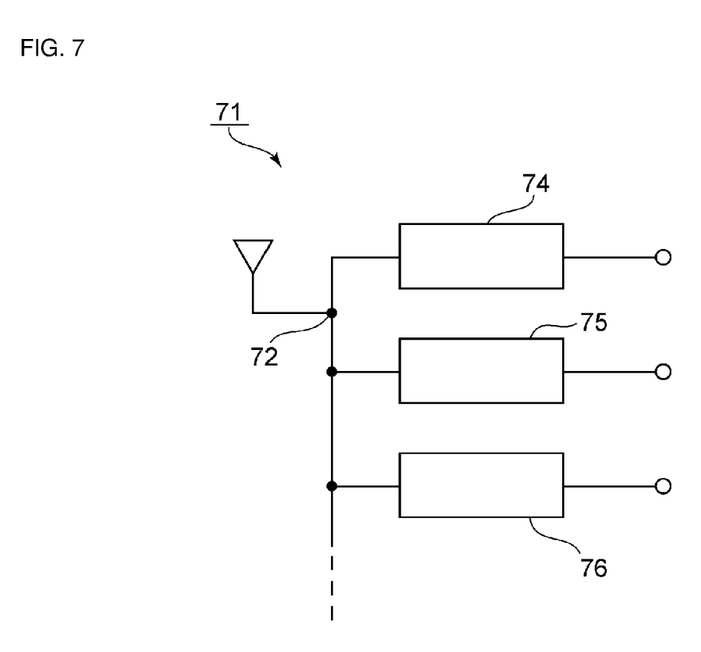
FIG. 7 is a circuit diagram illustrating a composite filter device as a fourth preferred embodiment of the present invention.

FIG. 7 is a circuit diagram illustrating a composite filter device according to a fourth preferred embodiment of the present invention.

In a composite filter device 71, one-end portions of a plurality of filter devices 74 to 76 are connected in common to a common connection point 72 that defines and functions as a common terminal or the like. In the composite filter device 71, an acoustic wave filter device according to a preferred embodiment of the present invention is included in at least one of the plurality of filter devices 74 to 76. Accordingly, also in the composite filter device 71, the use of an acoustic wave filter device according to a preferred embodiment of the present invention enables the attenuation in a specific frequency range outside the pass band to be sufficiently increased.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
a series arm connecting an input terminal and an output terminal;
a plurality of parallel arms connected between the series arm and a ground potential;
a longitudinally coupled resonator acoustic wave filter on the series arm, the longitudinally coupled resonator acoustic wave filter including an input port to which a signal is input, an output port from which a signal is output, an input-side ground port connected to the ground potential, and an output-side ground port connected to the ground potential; and
a first parallel arm resonator on a first parallel arm and a second parallel arm resonator on a second parallel arm, the first parallel arm and the second parallel arm being included in the plurality of parallel arms; wherein
in a first common connection, the input-side ground port of the longitudinally coupled resonator acoustic wave filter and a ground port of at least one of the first and second parallel arm resonators are connected in common;
in a second common connection separate from the first common connection, the output-side ground port of the longitudinally coupled resonator acoustic wave filter and a ground port of at least another one of the first and second parallel arm resonators are connected in common; and
an electrostatic capacitance of the first parallel arm resonator is different from an electrostatic capacitance of the second parallel arm resonator.

2. The acoustic wave filter device according to claim 1, further comprising:
a series arm resonator on the series arm; wherein
the series arm resonator and at least one of the first and second parallel arm resonators define a ladder filter.

3. The acoustic wave filter device according to claim 1, wherein the input-side ground port and the output-side ground port of the longitudinally coupled resonator acoustic wave filter are connected in common.

4. The acoustic wave filter device according to claim 1, further comprising:
a piezoelectric substrate on which the longitudinally coupled resonator acoustic wave filter and the first and second parallel arm resonators are provided; wherein
first and second lead wires are provided on the piezoelectric substrate and connected to ground potential-side end portions of the first and second parallel arm resonators, respectively.

5. The acoustic wave filter device according to claim 4, wherein a first inductance including an inductance of the first lead wire between the ground potential-side end portion of the first parallel arm resonator and the ground potential is different from a second inductance including an inductance of the second lead wire between the ground potential-side end portion of the second parallel arm resonator and the ground potential.

6. The acoustic wave filter device according to claim 1, wherein the acoustic wave filter device is a reception filter having a pass band of about 791 MHz to about 821 MHz.

7. The acoustic wave filter device according to claim 1, wherein the longitudinally coupled resonator acoustic wave filter includes first to fifth interdigital transducer electrodes and reflectors.

8. A composite filter device comprising:
a plurality of filter devices, one-end portions of which are connected in common to a common terminal; wherein
at least one of the plurality of filter devices is defined by the acoustic wave filter device according to claim 1.

9. The composite filter device according to claim 8, further comprising:
a series arm resonator on the series arm; wherein
the series arm resonator and at least one of the first and second parallel arm resonators define a ladder filter.

10. The composite filter device according to claim 8, wherein the input-side ground port and the output-side ground port of the longitudinally coupled resonator acoustic wave filter are connected in common.

11. The composite filter device according to claim 8, further comprising:
a piezoelectric substrate on which the longitudinally coupled resonator acoustic wave filter and the first and second parallel arm resonators are provided; wherein
first and second lead wires are provided on the piezoelectric substrate and connected to ground potential-side end portions of the first and second parallel arm resonators, respectively.

12. The composite filter device according to claim 11, wherein a first inductance including an inductance of the first lead wire between the ground potential-side end portion of the first parallel arm resonator and the ground potential is different from a second inductance including an inductance of the second lead wire between the ground potential-side end portion of the second parallel arm resonator and the ground potential.

13. The composite filter device according to claim 8, wherein at least one of the plurality of filter devices is a reception filter having a pass band of about 791 MHz to about 821 MHz.

14. The composite filter device according to claim 8, wherein the longitudinally coupled resonator acoustic wave filter includes first to fifth interdigital transducer electrodes and reflectors.

15. A multiplexer comprising:
a plurality of band pass filters with different pass bands, one-end portions of the plurality of band pass filters being connected in common; wherein
at least one of the plurality of band pass filters is defined by the acoustic wave filter device according to claim 1.

16. The multiplexer according to claim 15, further comprising:
a series arm resonator on the series arm; wherein
the series arm resonator and at least one of the first and second parallel arm resonators define a ladder filter.

17. The multiplexer according to claim 15, wherein the input-side ground port and the output-side ground port of the longitudinally coupled resonator acoustic wave filter are connected in common.

18. The multiplexer according to claim 15, further comprising:
a piezoelectric substrate on which the longitudinally coupled resonator acoustic wave filter and the first and second parallel arm resonators are provided; wherein first and second lead wires are provided on the piezoelectric substrate and connected to ground potential-side end portions of the first and second parallel arm resonators, respectively.

19. The multiplexer according to claim 18, wherein a first inductance including an inductance of the first lead wire between the ground potential-side end portion of the first parallel arm resonator and the ground potential is different from a second inductance including an inductance of the second lead wire between the ground potential-side end portion of the second parallel arm resonator and the ground potential.

20. The multiplexer according to claim 15, wherein the longitudinally coupled resonator acoustic wave filter includes first to fifth interdigital transducer electrodes and reflectors.

* * * * *